(12) United States Patent
Krivokapic

(10) Patent No.: US 6,194,293 B1
(45) Date of Patent: Feb. 27, 2001

(54) CHANNEL FORMATION AFTER SOURCE AND DRAIN REGIONS ARE FORMED

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/318,519

(22) Filed: May 25, 1999

(51) Int. Cl.[7] .................................................. H01L 21/425
(52) U.S. Cl. ............................................. 438/525; 438/302
(58) Field of Search ...................................... 438/525, 302, 438/162, 163, 166, 298, 185, 45, 174

(56) References Cited

U.S. PATENT DOCUMENTS

| | | | |
|---|---|---|---|
| 5,851,886 | 12/1998 | Peng | 438/289 |
| 5,970,353 * | 10/1999 | Sultan | 438/289 |
| 6,020,244 * | 2/2000 | Thompson et al. | 438/306 |
| 6,030,875 * | 2/2000 | May et al. | 438/302 |

* cited by examiner

Primary Examiner—David Nelms
Assistant Examiner—Dung A Le
(74) Attorney, Agent, or Firm—Skjerven Morrill MacPherson; Edward C. Kwok; Michael J. Halbert

(57) ABSTRACT

A channel region is formed in a device after the source and drain regions are formed by implanting ions into the channel region with a tilt angle using multiple rotations. A rapid thermal annealing step is performed to activate the channel dopant. Because the source and drain regions are already formed, a relatively low temperature, e.g., 990 to 1010 degrees Celsius, and short, e.g., 1 to 5 seconds, rapid thermal annealing step may be performed to activate the channel region. Thus, the dopant concentration in the channel region may be well localized and accurately controlled.

7 Claims, 1 Drawing Sheet

CHANNEL FORMATION AFTER SOURCE AND DRAIN REGIONS ARE FORMED

FIELD OF THE INVENTION

The present invention relates to fabricating semiconductor devices, and more particularly to ion implantation into the channel region.

BACKGROUND

Current processing methods for transistors, e.g., field effect transistors (FETs), metal oxide semiconductor devices (MOS), and complimentary MOS devices (CMOS), uses ion implantation in the channel region to control the threshold voltage of the device. The channel region becomes conductive when an appropriate gate to source voltage difference is applied to cause a conductive channel to form between the source and the drain. By controlling the channel dopant concentration, the threshold voltage may be controlled to achieve high performance transistors.

Conventionally, a blanket doping of the substrate with the intended channel implant is performed prior to gate formation. The gate oxide and gate are then formed followed by the source/drain regions. The implants are then activated with an annealing step. During the annealing step, transient enhanced diffusion occurs, causing the channel dopants (and the source/drain implants) to be redistributed in an uncontrolled fashion. Consequently, the channel dopant concentration is difficult to control using conventional methods.

Thus, there is a need for a method of forming well localized channel regions that is not redistributed by subsequent processing steps.

SUMMARY

In accordance with the present invention, a channel region is formed in a substrate after the source and drain regions are formed. By implanting ions into the channel region with a tilt angle, the location and concentration of the channel dopant is precisely controlled. A rapid thermal annealing step is then performed to activate the channel dopant. Because the source and drain regions are already formed, a relatively low temperature, e.g., 990 to 1010 degrees Celsius, and short, e.g., 1 to 5 seconds, rapid thermal annealing step may be performed to activate the channel region. Thus, the dopant concentration in the channel region is well localized and is not redistributed by subsequent processing. Because the implant is performed through the sidewall spacer, the energy is high enough that the channel is formed deep under the LDD extension regions, which advantageously prevents punchthrough.

DETAILED DESCRIPTION

Figure 1:
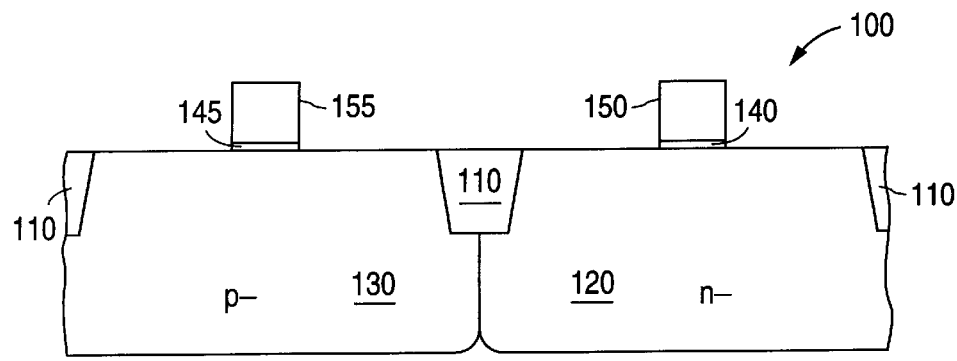
FIGS. 1–4 are simplified cross-sectional view of a semiconductor substrate in various stages in the fabrication of a CMOS device in accordance with an embodiment of the present invention.

FIG. 1 is a simplified cross-sectional view of a semiconductor substrate 100 in an intermediate stage in the fabrication of a Complementary Metal Oxide Silicon (CMOS) device in accordance with the present invention.

Semiconductor substrate 100 is shown in FIG. 1 with shallow trench isolation regions 110, which may be formed in a conventional manner. It should be understood that while isolation regions 110 are shown as shallow trench isolation regions 110, other methods of isolation can also be employed, such as Local Oxidation of Silicon (LOCOS) or selective epitaxial growth.

Substrate 100 is a p– type substrate in which an n-well region is formed, which will become PMOS region 120. It should be understood, that other type of substrates may be employed, for example, an n– type substrate may be used in which a p– type well is formed in what will become NMOS region 130, or an n or p– type substrate with n and p– type well regions and/or an epitaxial layer (not shown). The formation of n– type well in PMOS region 120 and p– type well (if used) in NMOS region 130 is accomplished in a conventional manner well known to those of ordinary skill in the art.

Gate dielectrics 140 and 145 and polysilicon gates 150 and 155 are formed over PMOS region 120 and NMOS region 130, respectively. Gate dielectrics 140, 145, which may be silicon oxide or silicon nitride, have a thickness of 1.5 to 4 nm (nanometers). Polysilicon gates 150 and 155 are formed overlying gate dielectrics 140 and 145, respectively. Gates 150, 155 are approximately 100 to 150 nm thick and have a gate length of 30 to 250 nm. It is understood that gates 150, 155 can also be formed out of amorphous silicon or a combination of amorphous silicon and polysilicon. Gate dielectrics 140, 145 and polysilicon gates 150, 155 are formed in a conventional manner, such as growing an oxide layer over substrate 100, depositing a layer of polysilicon by chemical vapor deposition and then patterning the gate structures through standard photolithography and etching techniques.

Figure 2:
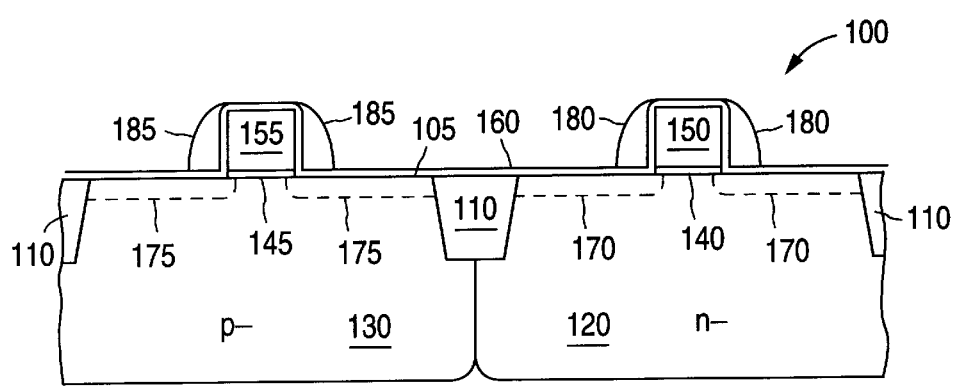
Figure 3:
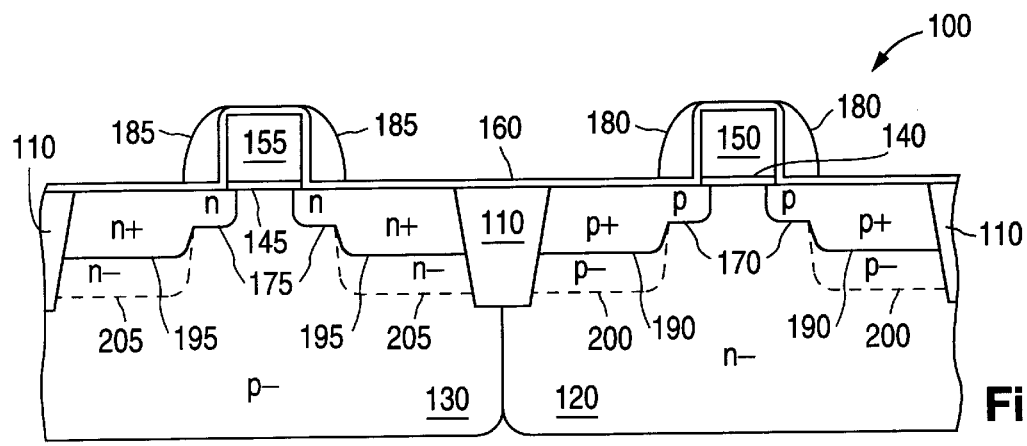

As shown in FIG. 2, lightly doped drains (LDD) are then formed in PMOS region 120 and NMOS region 130. An inactive LDD region 170 (indicated by the broken lines) is formed within PMOS region 120 by implanting boron ($BF_2$) or indium (In) at a dosage of approximately 5e13 to 1e15 $cm^{-2}$ at an energy of approximately 3–6 KeV for $BF_2$ and 5–15 KeV for In. It should be understood that during the implantation of the dopant into region 170, a masking step (not shown) is used to prevent unintentional implantation into the NMOS region 130, as is well known to those skilled in the art.

Likewise, an inactive LDD region 175 (indicated by the broken lines) is formed within NMOS region 130 by implanting arsenic (As) or Antimony (Sb) at a dosage of approximately 1e14 to 1e15 $cm^{-2}$ at an energy of approximately 3–8 KeV for As and 15–35 KeV for Sb. Another masking step (not shown) is used to prevent unintentional implantation into the PMOS region 120, as is well known to those skilled in the art.

Once the inactive LDD regions 170 and 175 are formed, a dielectric layer 160 is formed on the upper surface 105 of substrate 100 and over gates 150, 155. Dielectric layer 160 is a layer of oxide that is 5 to 10 nm thick and that is deposited using plasma enhanced chemical vapor deposition (PECVD). If desired, dielectric layer 160 may be formed before LDD regions 170 and 175 are formed, but then the $BF_2$ energy range should be 15 to 25 KeV and the As energy range should be 10 to 12 KeV.

Sidewall spacers 180, 185 are then formed on polysilicon gates 150, 155 Sidewall spacers 180, 185 are formed approximately 50 to 100 nm thick in a conventional manner, e.g., depositing a blanket layer of a dielectric material, such as silicon nitride, and anisotropically etching the layer leaving sidewall spacers 180, as shown in FIG. 2. Other dielectric materials, such as silicon oxide and/or a combination of oxide and nitride, may alternatively be used.

An n+ type dopant, such as arsenic (As), is then implanted creating source and drain regions 195, which are aligned with sidewall spacers 185. The As has an implant energy of approximately 10 to 30 KeV and a dosage of 2e15 to 4e15 $cm^{-2}$. In another embodiment, the n+ type dopant may be a combination of As and phosphorous (P). A rapid thermal anneal step of 5 to 15 seconds at 1030 to 1070 degrees Celsius is then used to activate the dopant, resulting in activated source and drain regions 195 and LDD region 175.

Likewise, a p+ type dopant, such as $BF_2$, is implanted creating source and drain regions 190, aligned with sidewall spacers 180. The $BF_2$ is implanted with an energy of 10 to 30 KeV with a dosage of 2e15 to 4e15. A second rapid thermal anneal step is used to activate the dopants. The second rapid thermal anneal lasts approximately 5 to 15 seconds and is at 1010 to 1030 degrees Celsius and results in activated source and drain regions 190 and LDD region 170.

During the respective n+ and p+ dopant source and drain implants, a masking step is used to protect the PMOS region 120 and NMOS region 130 respectively, as is well known to those skilled in the art.

A n-doped NMOS junction region 205 of P or As is then implanted. The NMOS junction region 205 may be implanted with P at an energy of 40 to 70 KeV and a dosage of 1e13 to 5e13 $cm^{-2}$, with As at an energy of 80 to 120 KeV and a dosage of 1e13 to 5e13 $cm^{-2}$, or a combination of the two dopants. The NMOS junction region 205, however, remains unactivated at this point, as illustrated by the broken line indicating region 205.

A p-doped PMOS junction region 200 is also formed at this point in the process. PMOS junction region 200 is formed by implanting boron (B) at an energy of 15 to 40 KeV and a dosage of 1e13 to 5e13 $cm^{-2}$ or $BF_2$ at an energy of 70 to 100 KeV and a dosage of 1e13 to 5e13 $cm^{-2}$. The PMOS junction region 200 also remain unactivated at this point, as illustrated by the broken line indicating region 200.

Once the source and drain regions have been formed, the channel dopant is then introduced into respective PMOS region 120 and NMOS region 130. The channel dopants are advantageously introduced by a tilted implant through the sidewall spacers 180 and 185 using four rotations. Because the source and drain regions have already been formed, the channel dopant will not be redistributed due to later processing.

By way of example, the PMOS channel region 210 is formed by implanting phosphorous (P) ions through sidewall spacers 180 with four rotations, where each rotation has an implant energy of 80 to 130 KeV, a dosage of 0.7e13 to 1.5e13 $cm^{-2}$, and a tilt of 20 to 45 degrees from normal.

The NMOS channel region 215 is formed by implanting boron (B) ions through sidewall spacers 185 with four rotations, where each rotation has an implant energy of 40 to 60 KeV, a dosage of 0.7e13 to 1.5e13 $cm^{-2}$, and a tilt of 20 to 45 degrees from normal. A high tilt angle, e.g., 45 degrees, provides a lower leakage current, while a lower tilt angle, e.g., 20 degrees, will produce a lower ovelap capacitance, which is advantageous for speed.

If desired, other types of dopants may be used to form channel region 210 and 215.

Figure 4:
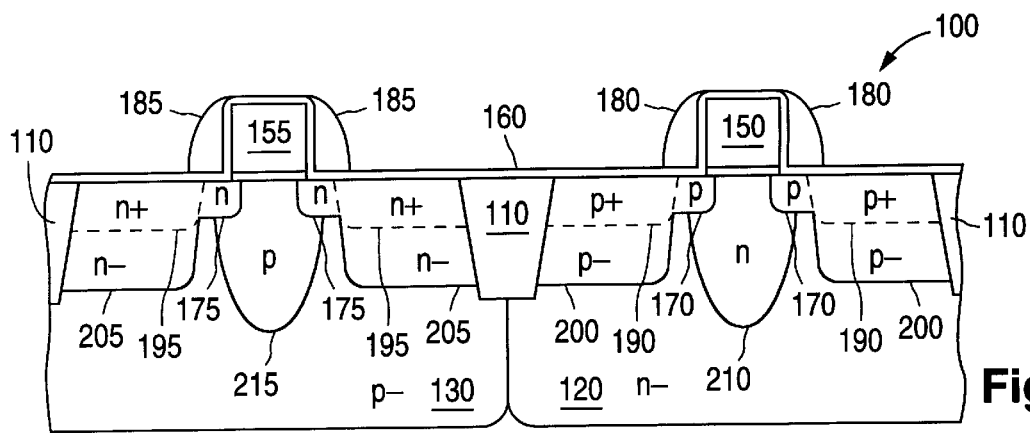

Channel regions 210 and 215 are then activated by a rapid thermal anneal step. Because the source and drain regions are already formed, a relatively short duration and low temperature rapid thermal anneal step may be used. For example, the rapid thermal anneal step used to activate channel regions 210 and 215 is approximately 1 to 5 seconds at 990 to 1010 degrees Celsius. The rapid thermal anneal step not only activates channel regions 210 and 215 but activates PMOS junction region 200 and NMOS junction region 205, as shown in FIG. 4. Advantageously, the relatively short and low temperature rapid thermal anneal activates the dopant in channel regions 210 and 215 without permitting uncontrolled distribution of the dopant. The localization of the channel dopants advantageously permits precise control over the channel dopant concentration. Thus, high performance transistors may be achieved. Moreover, the relatively short, low temperature rapid thermal anneal step does not disrupt the source and drain regions that have already been formed.

Thus, as shown in FIG. 4, the resulting structure includes a PMOS region 120 with an n doped channel region 210 as well as p+ doped source and drain regions 190, p- junction region 200, and p doped LDD regions 170 (the broken lines in FIG. 4 indicate division between the p+ source and drain regions 190 and the junction regions 200 and LDD regions 170). The resulting structure also includes a NMOS region 130 with p doped channel region 215 as well as n+ doped source and drain regions 195, n- junction regions 205, and n doped LDD regions 175 (the broken lines in FIG. 4 indicate division between the n+ source and drain regions 195 and the junction regions 205 and LDD regions 175).

With the desired channel dopants thus formed, without disturbing the already formed the source and drain regions, the remaining steps in the fabrication of the desired CMOS device may be conducted pursuant to conventional processing methods.

While the present invention has been described in connection with specific embodiments, variations of these embodiments will be obvious to those of ordinary skill in the art. For example, it should be understood that while a CMOS device is described in the present disclosure, that the present inventions may be used to form isolated transistors. The dopants may be implanted in a different order, with different dosages or energies, and remain within the teachings of the present disclosure. Further, the chosen masking steps in the present invention are conventional and are well understood by those of ordinary skill in the art. Therefore, the spirit and scope of the appended claims should not be limited to the foregoing description.

What is claimed is:

1. A method of forming a channel region in a substrate, the method comprising:

forming source and drain regions in a substrate;

implanting ions into a channel region between said source and drain regions, wherein said ions are implanted at a tilt angle; and annealing said substrate so as to activate said ions implanted into said channel region.

2. The method of claim 1, wherein implanting ions into a channel region is performed with a plurality of rotations.

3. The method of claim 1, further comprising:

forming a gate on a surface of said substrate;

forming spacers on the sidewalls of said gate; and wherein implanting ions into a channel region is implants ions through said spacers on the sidewalls of said gate.

4. The method of claim 3, further comprising:

forming lightly doped drain regions in said substrate before forming spacers on the sidewalls of said gate; and wherein forming source and drain regions in said substrate is performed after forming spacers on the sidewall of said gate.

5. The method of claim 1, further comprising forming a junction region in said substrate below said source and drain regions.

6. The method of claim 1, wherein annealing said substrate so as to activate said ions implanted into said channel region is performed at approximately 990 to 1010 degrees Celsius for approximately 1 to 5 seconds.

7. The method of claim 1, wherein said ions are implanted at a tilt angle of approximately 20 to 45 degrees from normal to the surface of said substrate.

\* \* \* \* \*